United States Patent [19]

Kulkarni

[11] Patent Number: 5,266,835
[45] Date of Patent: Nov. 30, 1993

[54] SEMICONDUCTOR STRUCTURE HAVING A BARRIER LAYER DISPOSED WITHIN OPENINGS OF A DIELECTRIC LAYER

[75] Inventor: Vivek D. Kulkarni, Sunnyvale, Calif.
[73] Assignee: National Semiconductor Corporation, Santa Clara, Calif.
[21] Appl. No.: 969,539
[22] Filed: Oct. 30, 1992

Related U.S. Application Data

[60] Continuation of Ser. No. 645,537, Jan. 24, 1991, abandoned, which is a division of Ser. No. 437,328, Nov. 17, 1989, which is a continuation of Ser. No. 151,345, Feb. 2, 1988, abandoned.

[51] Int. Cl.$^5$ ............... H01L 29/68; H01L 29/34; H01L 29/06
[52] U.S. Cl. ............... 257/751; 257/752; 257/763; 257/767
[58] Field of Search ............... 357/71, 59, 67, 68; 257/751, 763, 752, 751, 763, 767

[56] References Cited

U.S. PATENT DOCUMENTS

| | | | |
|---|---|---|---|
| 3,560,358 | 2/1971 | Black | 357/71 |
| 4,267,012 | 5/1981 | Pierce et al. | 29/591 |
| 4,361,599 | 11/1982 | Wourms | 357/71 |
| 4,392,298 | 7/1983 | Barker et al. | 29/591 |
| 4,410,622 | 10/1983 | Dalal et al. | . |
| 4,532,702 | 8/1985 | Gigante et al. | 29/591 |
| 4,582,563 | 4/1986 | Hazuk et al. | 357/71 |
| 4,614,021 | 9/1986 | Hulseweh | . |
| 4,617,193 | 10/1986 | Wa | 427/38 |
| 4,631,806 | 12/1986 | Poppert et al. | . |
| 4,641,420 | 2/1987 | Lee | 357/71 |
| 4,683,645 | 8/1987 | Naguib et al. | 437/41 |
| 4,700,465 | 10/1987 | Sirkin | 357/71 |
| 4,792,842 | 12/1988 | Honma et al. | 357/71 |
| 4,809,055 | 2/1989 | Ishibashi et al. | 357/71 |
| 4,824,527 | 4/1989 | Kulkarni et al. | . |
| 4,892,845 | 1/1990 | Bridges | 437/189 |
| 4,954,423 | 9/1990 | McMann et al. | . |
| 4,956,423 | 9/1990 | Cote et al. | . |
| 5,128,744 | 7/1992 | Asano et al. | 257/763 |

FOREIGN PATENT DOCUMENTS

| | | |
|---|---|---|
| 0114672 | 6/1978 | Japan . |
| 0090886 | 8/1978 | Japan . |
| 0112688 | 10/1978 | Japan . |
| 0111772 | 1/1979 | Japan . |
| 0053443 | 4/1980 | Japan . |
| 0135944 | 10/1981 | Japan . |
| 0165339 | 12/1981 | Japan . |
| 0102053 | 6/1982 | Japan . |
| 0106124 | 7/1982 | Japan . |
| 0166048 | 10/1982 | Japan . |
| 0025219 | 2/1984 | Japan . |
| 0053020 | 3/1985 | Japan . |
| 0242620 | 12/1985 | Japan . |
| 0003431 | 1/1986 | Japan . |
| 0150239 | 7/1986 | Japan . |
| 0181146 | 8/1986 | Japan . |
| 0208850 | 9/1986 | Japan . |
| 0224439 | 10/1986 | Japan . |

OTHER PUBLICATIONS

Saxena, et al., "Manufacturing Issues and Emerging Trends in VLSI Multilevel Metallizations," 1986 Proceedings Third International IEEE VLSI Multilevel Interconnection Conference, Jun. 9–10, pp. 9–21.
Castel, et al., "Multilevel Metallization with Pillar Interconnects and Planarization," 1987 Proceedings of the First International Symposium on Ultra Large Scale Integration Science and Technology, ULSI Science and Technology, Proceedings Vol. 87-11, pp. 554–556.

*Primary Examiner*—Jerome Jackson
*Assistant Examiner*—D. Monin
*Attorney, Agent, or Firm*—Townsend and Townsend Khourie and Crew

[57] ABSTRACT

A method for connecting devices on an integrated circuit substrate to a metallization layer, wherein a thin layer of a dielectric material is deposited on the substrate, and openings are formed in the dielectric layer wherein electrical connection is to be made to the substrate. A metal barrier layer then is deposited selectively in the openings of the dielectric layer, the barrier layer completely covering the exposed portions of the substrate. A pillar metal layer then may be deposited as a blanket coating over the dielectric layer and over the portions of he barrier layer covering the exposed portions of the substrate. The pillar metal layer is etched for forming metal pillars extending from the exposed portions of the substrate. The substrate then is planarized by depositing a dielectric layer and etching it back for exposing the pillars for coupling to a later deposited metallization layer.

22 Claims, 4 Drawing Sheets

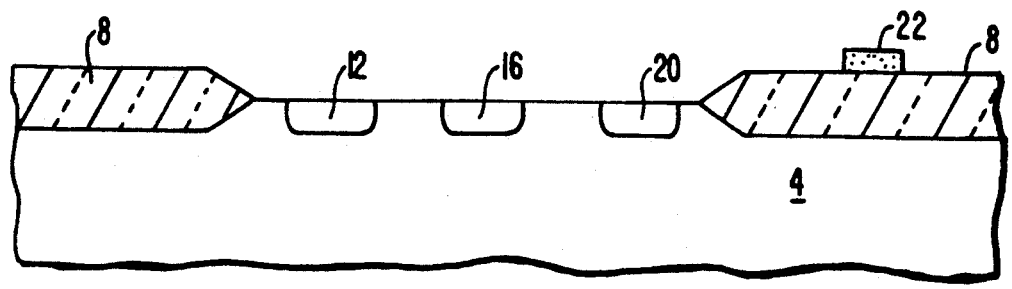
FIG._1.
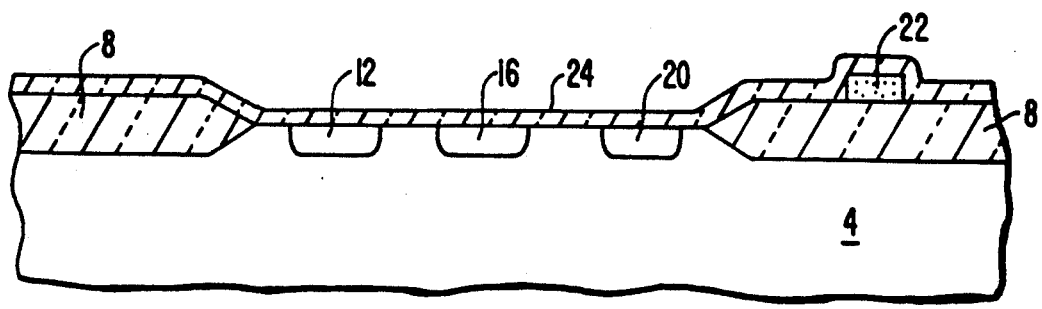
FIG._2.
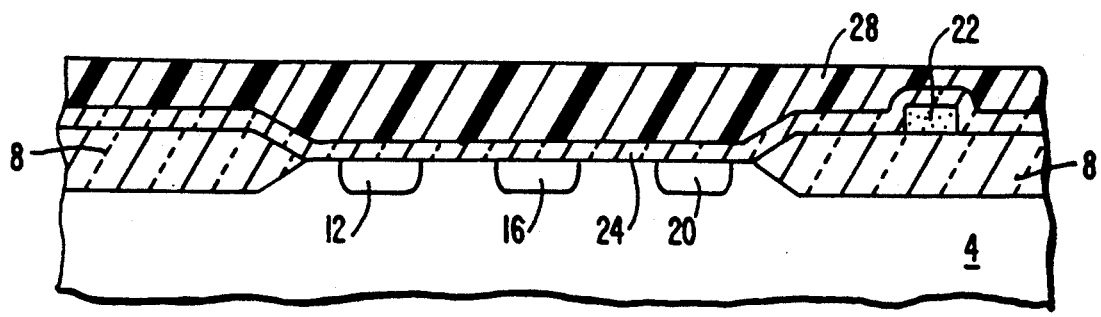
FIG._3.
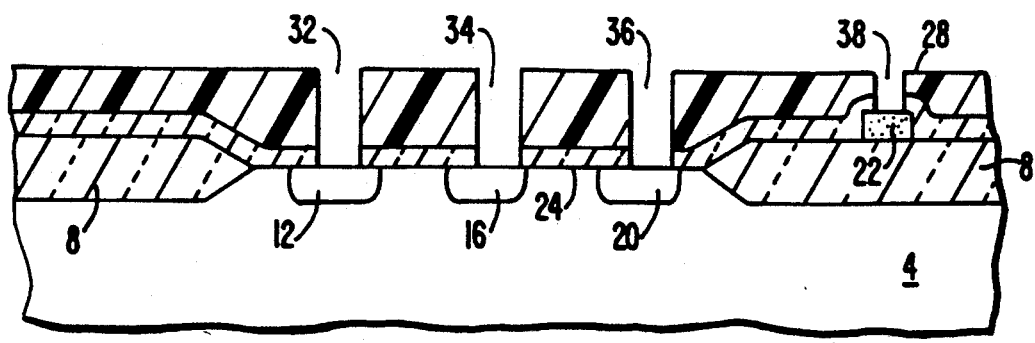
FIG._4.

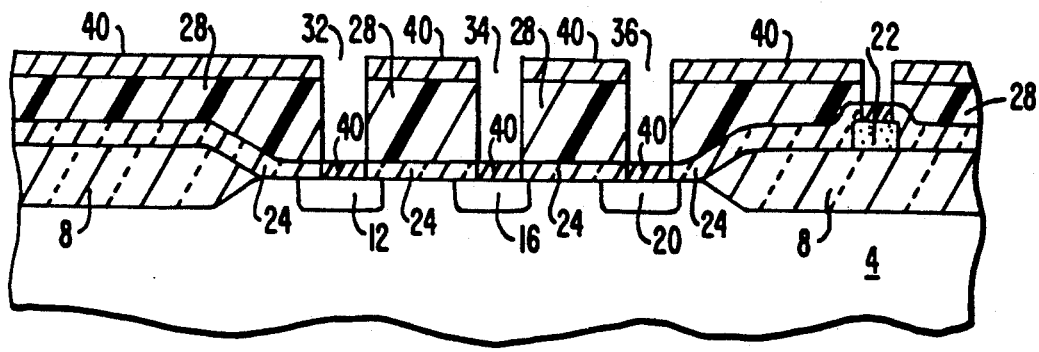
FIG._5.
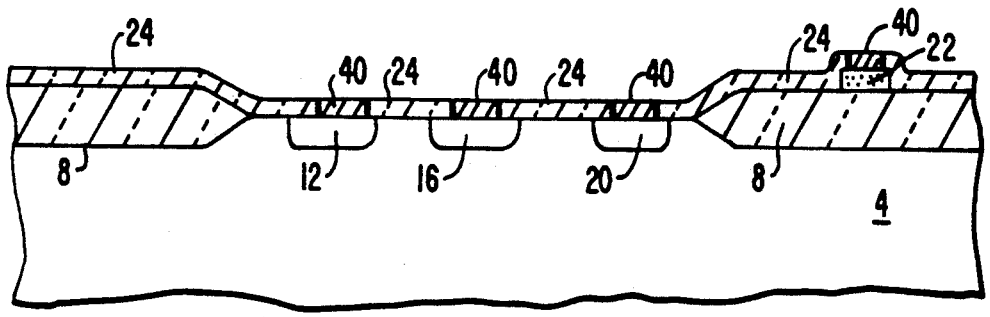
FIG._6.
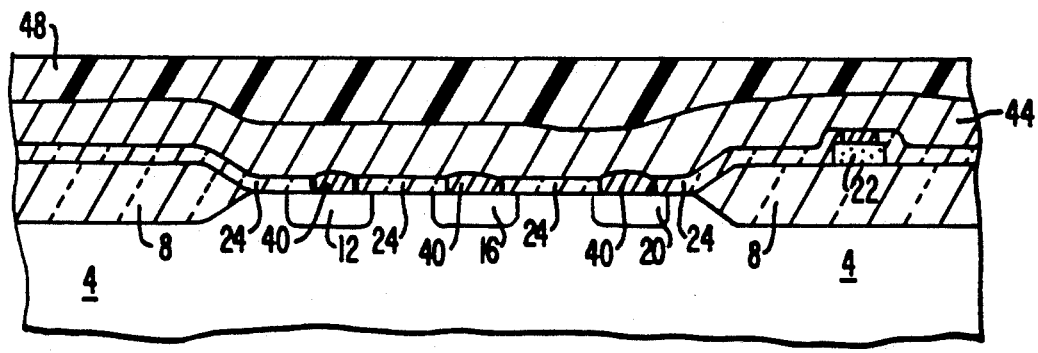
FIG._7.
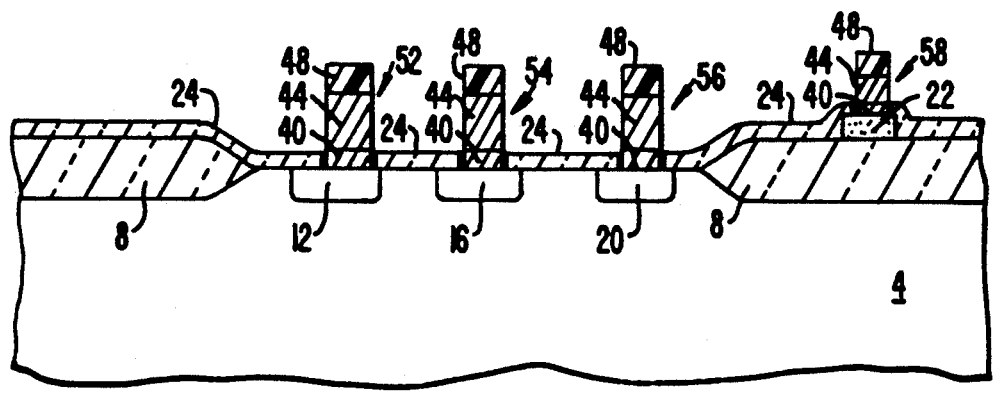
FIG._8.

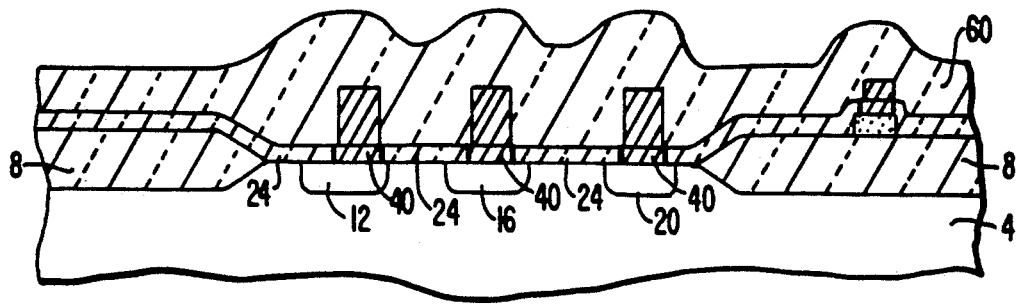
FIG._9.
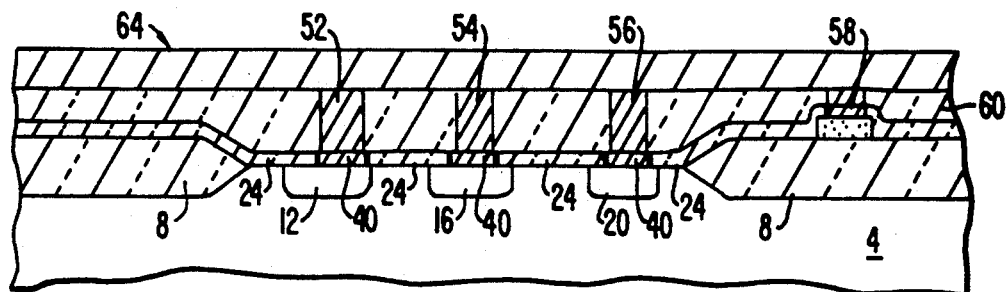
FIG._10.
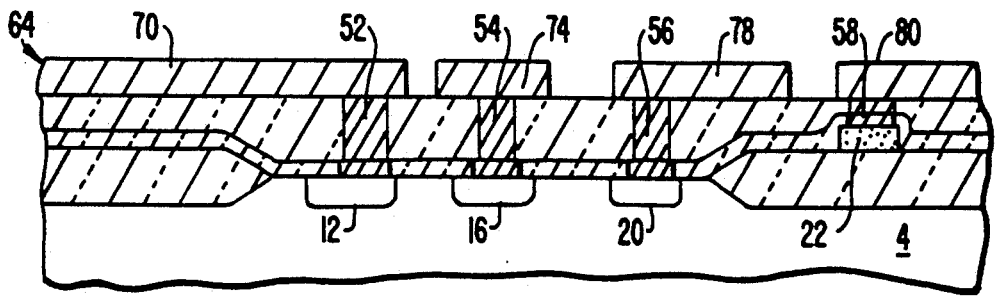
FIG._11.
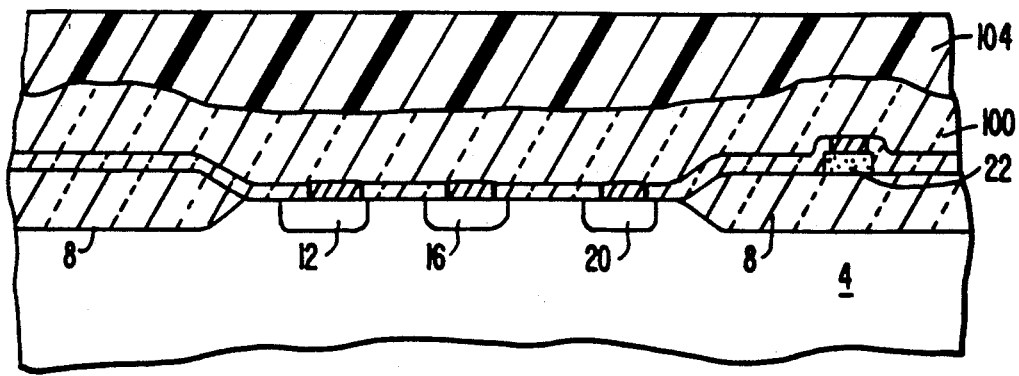
FIG._12.

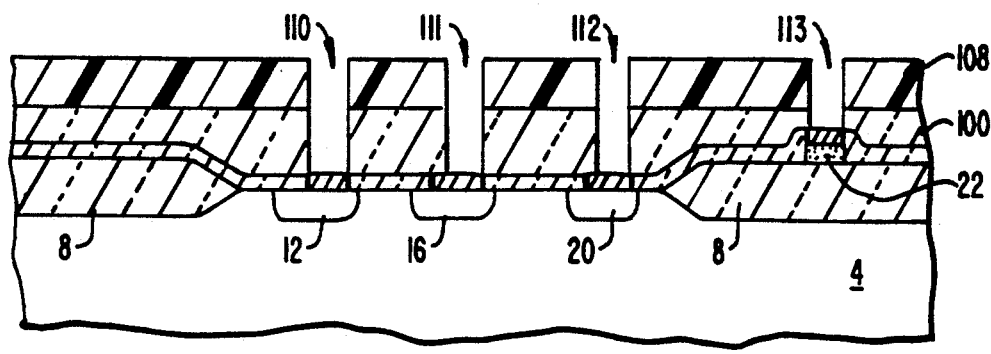
FIG._13.
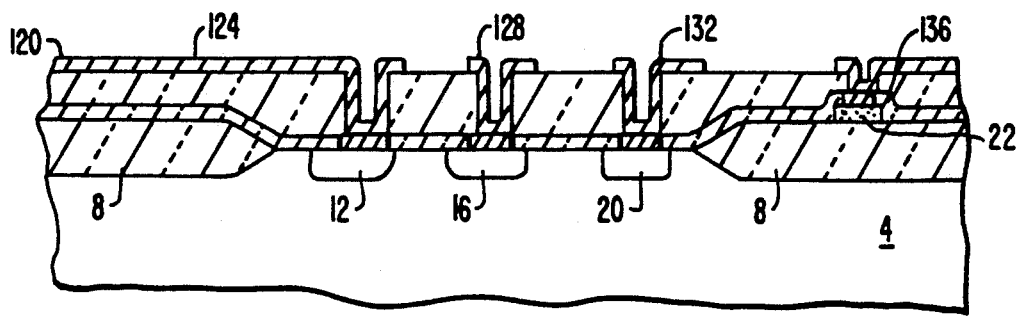
FIG._14.

SEMICONDUCTOR STRUCTURE HAVING A BARRIER LAYER DISPOSED WITHIN OPENINGS OF A DIELECTRIC LAYER

This is a continuation of Ser. No. 07/645,537, filed Jan. 24, 1991, now abandoned, which is a division of copending application Ser. No. 07/437,328, filed Nov. 17, 1989, which is a continuation of Ser. No. 07/151,345, filed Feb. 2, 1988, now abandoned.

BACKGROUND OF THE INVENTION

1. Field of the Invention

This invention relates to semiconductor devices and, more particularly, to a method for connecting the devices on an integrated circuit substrate to a metallization layer.

2. Description Of The Relevant Art

Many techniques are known for connecting features on an integrated circuit substrate, such as the source, drain, and gate of MOS transistors or the emitter, base, and collector of bipolar transistors, to a metallization layer, or for connecting two successive metallization layers in a multi-level interconnect scheme. One such technique uses etched contacts and vias which require successive placement of metal and dielectric layers over the substrate features, resulting in very uneven surfaces. Planarization of the interlevel dielectric layer to smooth the surface results in contact holes of different depths which cause difficulties in etching, such as prolonged overetch of certain features in the substrate. Another technique uses metal pillars in place of etched contacts and vias. This scheme offers the advantages of higher device packing density and smooth, planar surface topography. To form the pillars which connect the devices formed in the substrate to metallization layers above the substrate, the pillar metal layers typically are deposited in the appropriate sequence directly on top of the features on the wafer. These features include junction and electrode areas (possibly silicided), oxide and trench isolation features, oxide spacers around certain features, etc. After pillar metal deposition and lithography, the metal layers are dry-etched from top to bottom, i.e., down to the aforementioned features in the substrate. The substrate features thus are exposed again at the end of metal pillar definition. If the dry etch selectivity between the bottom pillar metal layer (which may be an etch-stop/diffusion barrier layer consisting of titanium and tungsten, either as an alloy or separate layers) and any of the exposed materials on the substrate (e.g., silicon or titanium silicide) is poor, the bottom metal layer must be wet-etched in a suitable solution (e.g., a mixture of hydrogen peroxide and ammonium hydroxide), which affords good selectivity to all the exposed materials on the substrate.

There are several disadvantages associated with this procedure for defining the metal pillars. For example, the non-uniformity of dry-etch rate across a wafer or from wafer to wafer in a batch of wafers etched together sometimes results in a significant erosion of the etch-stop layer during the dry-etch process, and this results in attack on any inadvertently exposed features on the substrate. The glow discharge radiation from the dry-etch process also can damage the exposed devices. Furthermore, the abrupt topography of some features in the substrate, such as polysilicon gates of MOS transistors, leads to poor coverage of the metallization layer over the steps formed by such features. Voids or cracks are sometimes observed in the metal layer covering the steps, and these voids and cracks can grow larger during subsequent processing, e.g., during lithography. During the pillar metal-etch, such voids or cracks can result in a substantial attack on the exposed substrate. Finally, unevenness in the substrate features also frequently leads to the formation of metal residue ribbons or stringers along steep edges of the features, as well as metal residue in the narrow spaces between the pillars and adjacent substrate features (e.g., polysilicon gates). Both defects cause undesirable electrical shorting.

For additional background information on the foregoing, see MULTILEVEL METALLIZATION WITH PILLAR INTERCONNECTS AND PLANARIZATION, EGIL D. CASTEL, VIVEK D. KULKARNI, AND PAUL E. RILEY, PROCEEDINGS OF THE FIRST INTERNATIONAL SYMPOSIUM ON ULTRA-LARGE SCALE INTEGRATION SCIENCE AND TECHNOLOGY, VOL. 87-11, THE ELECTROCHEMICAL SOCIETY, 1987, and references cited therein, all of which are incorporated herein by reference.

SUMMARY OF THE INVENTION

The present invention is directed to a method for connecting devices on an integrated circuit substrate to a metallization layer or for connecting two successive metallization layers in a multi-level interconnect scheme. The methods and structures used result in devices which are unaffected by non-uniformity of pillar metal etch rate, voids or cracks in the metal, poor step coverage of the pillar metal over abrupt substrate transitions, and metal residue ribbons or stringers along steep edges and in narrow spaces. They also result in an improved contact etch process through different dielectric thicknesses when the dielectric layer is planarized.

In one embodiment of a device constructed according to the present invention, a thin layer of a dielectric material is deposited on the substrate, and a photoresist layer is deposited on the dielectric layer. Openings are formed in the photoresist layer and then transferred to the dielectric layer where an electrical connection is to be made to the substrate. A metal barrier layer then is selectively deposited in the openings of the dielectric layer, the barrier layer completely covering the exposed portions of the substrate. A pillar metal layer then is deposited as a blanket coating over the dielectric layer and over the portions of the barrier layer covering the exposed portions of the substrate. A photoresist layer is subsequently deposited, and the pillar mask is defined in the photoresist layer. The pillar metal layer then may be etched for forming metal pillars extending from the exposed portions of the substrate. The substrate then is planarized with a dielectric, and the dielectric is etched back for exposing the pillars for coupling to a later deposited metallization layer.

These and other features and advantages of the invention will become apparent to those skilled in the art upon a reading of the following detailed description of the invention, which should be taken in conjunction with the accompanying drawings.

BRIEF DESCRIPTION OF THE DRAWINGS

FIGS. 1-11 illustrate the steps, according to the invention, for connecting devices on an integrated circuit substrate to a metallization layer.

FIGS. 12-14 illustrate the steps according to an alternate embodiment of the invention for connecting de-

DETAILED DESCRIPTION OF THE PREFERRED EMBODIMENTS

FIG. 1 is a cross-sectional view of an integrated circuit substrate 4, including field oxide regions 8, device regions 12, 16, 20, and a polysilicon contact region 22. Regions 12, 16, 20, and 22 are intended to be used for connecting one or more components of active devices disposed in substrate 4 to a later-formed metallization layer. Regions 12, 16, and 20 may be, for example, substrate regions which connect to a source or drain of a MOS transistor or to a base, collector, or emitter of a bipolar transistor. Although regions 12, 16, and 20 are generally shown as discrete, horizontally spaced regions, the regions, in fact, may be physically embedded within one another or may even be disposed on top of substrate 4, such as the polysilicon gate of a MOS transistor. Furthermore, contact to regions 12, 16, and 20 need not be made directly, but may be made through indirect paths to other structures, such as to polysilicon contact region 22 on field oxide region 8. Consequently, regions 12, 16, and 20, and the contacts to be made to them, are so shown for illustrative purposes only.

The first step in the method according to the present invention is to form a thin dielectric layer 24 as a blanket coating over substrate 4 and oxide regions 8. Dielectric layer 24 may be, for example, silicon nitride or undoped or phosphorous-doped silicon dioxide, having a thickness of from approximately 1000 angstroms to approximately 2000 angstroms, preferably 1500 angstroms. Dielectric layer 24 may be deposited by chemical vapor deposition (CVD). Next, as shown in FIG. 3, a photoresist layer 28 is deposited over dielectric layer 24. Photoresist layer 28 may be deposited by spinning to a thickness of approximately 1 $\mu$m.

Then, as shown in FIG. 4, contact holes 32, 34, 36, and 38 are formed in photoresist layer 28. The contact holes are subsequently transferred to the dielectric layer 24 in those places where an electrical connection is to be made to regions 12, 16, 20, and 22, respectively. Photoresist layer 28 may be developed using well known photolithographic techniques. The contact holes are formed in dielectric layer 24 by dryetching in a suitable fluorinated plasma, such as carbon tetrafluoride. The contact holes may be slightly overexposed to account for later misalignment between these holes and the pillars, as long as the contact holes do not touch the adjacent junction or electrode areas or neighboring contact holes. Since dielectric layer 24 is thin, its thickness non-uniformity is not large, and a 10-20% over-etch would result in only a minimal erosion of the exposed substrate materials (typically less than 50 angstroms for silicon or titanium silicide, and less than 200 angstroms for isolation oxide).

Next, as shown in FIG. 5, after the contact holes 32, 34, 36, and 38 are etched in dielectric layer 24, a barrier layer 40, preferably consisting of a titanium and tungsten alloy, is deposited by evaporation to a thickness of from approximately 1000 angstroms to 4000 angstroms, preferably 3000 angstroms, without removing the photoresist. Thus, the metal barrier layer covers the remaining portions of photoresist 28 and is disposed within contact holes 32, 34, 36, and 38 for completely covering the exposed portions of regions 12, 16, 20, and 22. The metal barrier layer on top of photoresist 28 is not connected to the metal barrier layer disposed within the contact holes 32, 34, 36, and 38.

Then, as shown in FIG. 6, photoresist layer 28 and the portions of barrier layer 40 covering it are removed together, typically by dissolving the photoresist in an organic solvent, for example. This leaves the portions of barrier layer 40 covering regions 12, 16, 20, and 22. The remaining portions of barrier layer 40 covering regions 12, 16, 20, and 22 are self-aligned with the exposed portions of those regions.

Instead of the liftoff technique just described in FIGS. 5 and 6, barrier layer 40 may be deposited directly into contact holes 32, 34, 36, and 38, without using photoresist layer 28 for self-alignment. In this case, after contact holes 32, 34, 36, and 38 are formed, as shown in FIG. 4, photoresist layer 28 is removed, and barrier layer 40, preferably comprising tungsten, is deposited by selective chemical vapor deposition to fill contact holes 32, 34, 36, and 38 directly, as shown in FIG. 6.

Next, as shown in FIG. 7, a pillar metal layer 44, typically aluminum, is deposited by sputtering to a thickness of approximately 1 $\mu$m as a blanket coating over silicon dioxide layer 24 and over the remaining portions of barrier layer 40 covering the exposed portions of regions 12, 16, 20, and 22. Then, a photoresist layer 48 is deposited over metal layer 44, preferably by spinning to a thickness of approximately 1.5 $\mu$m. Photoresist layer 48 is used for defining the metal pillars to be formed by metal layer 44. Typically, the pillar mask is the inverse of the mask used earlier to define the contact openings in dielectric layer 24.

In the next step, as shown in FIG. 8, photoresist layer 48 is developed, leaving portions of photoresist layer 48 disposed over metal layer 44 where pillars are to be formed. Typically, the remaining portions of photoresist layer 48 are aligned with the remaining portions of barrier layer 40 covering the exposed portions of regions 12, 16, 20, and 22. Metal layer 44 then is etched down to silicon dioxide layer 24, preferably by dry-etching in a chlorine-containing plasma, such as chlorine and boron trichloride, for forming, with the remaining portions of barrier layer 40, pillars 52, 54, 56, and 58, contacting and extending generally perpendicularly from regions 12, 16, 20, and 22, respectively. The remaining portions of photoresist layer 48 disposed over pillars 52, 64, 56, and 58, respectively, then may be removed in the same manner as photoresist layer 28.

Dielectric layer 24, combined with the remaining portions of barrier layer 40, completely protect the features of substrate 4 during etching of metal layer 44. For example, the remaining portions of barrier layer 40 disposed over regions 12, 16, 20, and 22 protect those regions during etching in the event that the remaining portions of photoresist layer 48 are slightly misaligned. Additionally, because of the combined protection, substrate 4 will be unaffected by the existence of voids or cracks in metal layer 44 or poor step coverage of metal layer 44. Finally, since the substrate is protected, the etching of metal layer 44 may be performed over a much longer period of time to ensure total removal of unwanted portions of metal layer 44. Hence, metal ribbons, stringers, and other unwanted metal residue are avoided.

After pillars 52, 54, 56, and 58 have been formed, a dielectric layer 60, such as silicon dioxide, may be deposited as a blanket coating over substrate 4, preferably by CVD, as shown in FIG. 9. Dielectric layer 60 then is planarized, as shown in FIG. 10, using the well known etch-back planarization technique, to expose pillars 52, 54, 56, and 58, and a metal layer 64, typically aluminum, is blanket-coated over dielectric layer 60 to a thickness of approximately .7 microns for contacting the exposed portions of pillars 52, 54, 56, and 58. Metal layer 64 forms the metal interconnects to pillars 52, 54, 56, and 58, and hence the electrical contacts to regions 12, 16, 20, and 22.

Finally, as shown in FIG. 11, metal layer 64 is selectively patterned by dry-etching in a chlorinebased plasma for forming an interconnect path 70 electrically coupled to pillar 52 and region 12, an interconnect path 74 electrically connected to pillar 54 and region 16, an interconnect path 78 electrically connected to pillar 56 and region 20, and an interconnect path 80 electrically connected to pillar 58 and polysilicon contact region 22.

While the above is a complete description of a preferred embodiment of the present invention, various modifications may be employed. For example, metallization layer 44, which may include a barrier layer, may be deposited directly over dielectric layer 24 and the exposed portions of regions 12, 16, 20, and 22. Since the substrate is protected by dielectric layer 24, dielectric layer 60 may include polyimide or spin-on glass for improved planarization. The sequence of FIGS. 2-11 also may be performed over interconnect paths 70, 74, and 78 to connect these paths to successive metal layers formed above them.

Finally, if desired, the method according to the present invention may be used with a traditional contact and via approach to device interconnection. In that case, after the structure shown in FIG. 6 is obtained, processing continues in accordance with FIGS. 12-14. As shown in FIG. 12, a layer of dielectric, such as silicon dioxide, may be deposited to a thickness of approximately one micron as a blanket coating over substrate 4, preferably by CVD. Dielectric layer 100 may also consist of a polyimide or spin-on glass, since the dielectric layer does not directly contact the features on substrate 4. A sacrificial photoresist layer 104 then is spun over dielectric layer 100. Next, as shown in FIG. 13, dielectric layer 100 is planarized using the well known etchback planarization technique, and a new photoresist layer 108 is deposited and patterned to form contact holes 110, 111, 112, and 113. The mask used to define these contact holes is typically the same as that used to define the openings in dielectric layer 24. The pattern in photoresist layer 108 is transferred to dielectric layer 100 by etching in a suitable fluorinated plasma, such as carbon tetrafluoride. Of course, if desired, dielectric layer 100 need not be planarized. Instead, photoresist mask 108 may be placed directly over dielectric layer 100, and then the contact holes etched. Again, since the features in substrate 4 are protected by the remaining portions of barrier layer 40 and/or dielectric layer 24, the problem of over-etching certain features in the substrate while defining contact holes of different depths is avoided.

After the contact holes are formed, a metal layer 120 is deposited, preferably by sputtering, as shown in FIG. 14. Afterward, metal layer 120 is selectively etched for forming an interconnect path 124, electrically coupled to region 12; an interconnect path 128 electrically coupled to region 16; an interconnect path 132 electrically coupled to region 20; and an interconnect path 136 electrically coupled to polysilicon contact region 22.

From the foregoing, it is apparent that the scope of the invention should not be limited, except as properly described in the claims.

What is claimed:

1. A semiconductor structure comprising:
   an integrated circuit component;
   a thin dielectric layer having a thickness of from approximately 1000 angstroms to approximately 2000 angstroms disposed over the integrated circuit component and having an opening which exposes a portion of the integrated circuit component where an electrical connection is made to the integrated circuit component;
   a conductive barrier layer completely covering the exposed portion of the integrated circuit component and being laterally limit along substantially its entire thickness to a closed boundary defined by sidewall portion of the thin dielectric layer which form the opening, the barrier layer having a thickness of from approximately 1000 angstroms to approximately 4000 angstroms;
   a thick planar dielectric layer disposed over the integrated circuit component and having an opening for exposing an upper surface of the barrier layer;
   wherein an upper surface of the thick dielectric layer defining the opening is disposed above the upper surface of the barrier layer so that a side wall of the thick dielectric layer extends downwardly toward the barrier layer;
   a metal contact layer disposed over the thick dielectric layer, extending into the opening in the thick dielectric layer along the side wall of the thick dielectric layer and contacting the barrier layer; and
   wherein the metal contact layer has a substantially uniform thickness over its entire length.

2. The semiconductor structure according to claim 1 wherein the metal contact layer is thinner than the thick dielectric layer.

3. The semiconductor structure according to claim 1 wherein the thin dielectric layer has a thickness of approximately 1500 angstroms.

4. The semiconductor structure according to claim 1 wherein the barrier layer has a thickness of approximately 3000 angstroms.

5. The semiconductor structure according to claim 1 wherein the thin dielectric layer has a thickness of approximately 1500 angstroms, and wherein the barrier layer has a thickness of approximately 3000 angstroms.

6. The semiconductor structure according to claim 1 wherein the exposed portion of the integrated circuit component comprises a device region disposed in a substrate.

7. The semiconductor structure according to claim 1 wherein the exposed portion of the integrated circuit component comprises a polysilicon contact layer.

8. The semiconductor structure according to claim 1 wherein the barrier layer comprises titanium.

9. The semiconductor structure according to claim 1 wherein the barrier layer comprises tungsten.

10. The semiconductor structure according to claim 1 wherein the barrier layer comprises a titanium and tungsten alloy.

11. A semiconductor structure comprising:
    an integrated circuit component;
    a thin dielectric layer having a thickness of from approximately 1000 angstroms to approximately 2000 angstroms disposed over the integrated circuit component and having an opening which exposes a portion of the integrated circuit component where an electrical connection is made to the integrated circuit component;

a conductive barrier layer completely covering the exposed portion of the integrated circuit component and being laterally limited along substantially its entire thickness to a closed boundary defined by sidewall portion of the thin dielectric layer which form the opening, the barrier layer having a thickness of from approximately 1000 angstroms to approximately 4000 angstroms;

a thick planar dielectric layer disposed over the integrated circuit component and having first and second sidewall portions defining an opening for exposing the barrier layer;

a metal contact layer comprising:
 a first horizontally extending layer portion disposed over an upper surface of the thick dielectric layer;
 a second horizontally extending layer portion contacting the barrier layer;
 a first vertically extending layer portion disposed on the first sidewall, connected to the first horizontally extending layer portion and to the second horizontally extending layer portion, and having a first vertically extending surface facing toward the second sidewall and being spaced apart therefrom.

12. A semiconductor structure according to claim 11 wherein the metal contact layer further comprises a second vertically extending layer portion disposed on the second sidewall, connected to the second horizontally extending layer portion, extending to the upper surface of the thick dielectric layer, and having a second vertically extending surface facing toward the first vertically extending surface and being spaced apart therefrom.

13. The semiconductor structure according to claim 12 wherein the metal contact layer has a substantially uniform thickness over its entire length.

14. The semiconductor structure according to claim 11 wherein the metal contact layer is thinner than the thick dielectric layer.

15. The semiconductor structure according to claim 11 wherein the thin dielectric layer has a thickness of approximately 1500 angstroms.

16. The semiconductor structure according to claim 11 wherein the barrier layer has a thickness of approximately 3000 angstroms.

17. The semiconductor structure according to claim 11 wherein the thin dielectric layer has a thickness of approximately 1500 angstroms, and wherein the barrier layer has a thickness of approximately 3000 angstroms.

18. The semiconductor structure according to claim 1 wherein the exposed portion of the integrated circuit component comprises a device region disposed in a substrate.

19. The semiconductor structure according to claim 11 wherein the exposed portion of the integrated circuit component comprises a polysilicon contact layer.

20. The semiconductor structure according to claim 11 wherein the barrier layer comprises titanium.

21. The semiconductor structure according to claim 11 wherein the barrier layer comprises tungsten.

22. The semiconductor structure according to claim 11 wherein the barrier layer comprises a titanium and tungsten alloy.

* * * * *